(12) United States Patent
Watanabe

(10) Patent No.: US 6,339,556 B1
(45) Date of Patent: Jan. 15, 2002

(54) SEMICONDUCTOR MEMORY DEVICE

(75) Inventor: Kazuo Watanabe, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/712,676

(22) Filed: Nov. 14, 2000

(30) Foreign Application Priority Data

Nov. 15, 1999 (JP) ........................................... 11-324727

(51) Int. Cl.[7] ............................. G11C 7/02; G11C 16/04
(52) U.S. Cl. .................................... 365/210; 365/185.2
(58) Field of Search ..................... 365/185.13, 185.2, 365/185.21, 189.07, 210

(56) References Cited

U.S. PATENT DOCUMENTS

| | | | | |
|---|---|---|---|---|
| 5,828,602 A | * | 10/1998 | Wong | 365/185.2 |
| 6,163,484 A | * | 12/2000 | Uekubo | 365/185.2 |
| 6,181,602 B1 | * | 1/2001 | Campardo et al. | 365/185.21 |
| 6,191,979 B1 | * | 2/2001 | Uekubo | 365/185.2 |

FOREIGN PATENT DOCUMENTS

JP    11-003599    1/1999

* cited by examiner

*Primary Examiner*—Trong Phan

(57) ABSTRACT

A semiconductor memory device having a plurality of cell arrays and one reference cell array according to the present invention includes a first current-to-voltage converting means that converts a cell current input from a cell array into a main cell voltage, a second current-to-voltage converting means that converts a reference cell current input from the reference cell array into a reference cell voltage, a global bit line that connects the first current-to-voltage converting means and the plurality of cell arrays, and a dummy global bit line that connects the second current-to-voltage converting means and the reference cell array, wherein the impedance of the global bit line is equal to the impedance of the dummy global bit line.

9 Claims, 8 Drawing Sheets

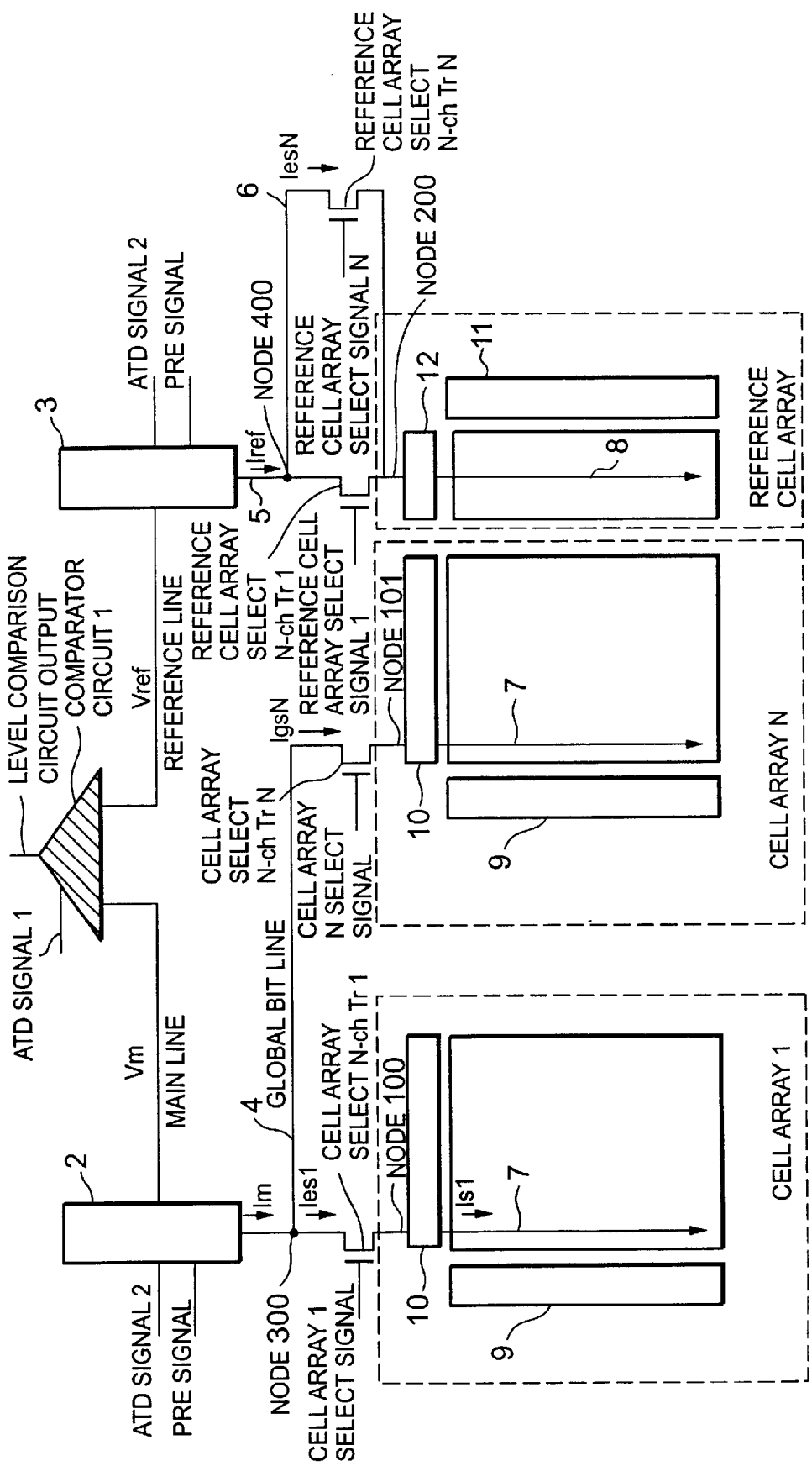

L=LR  W=WR  →  Zg1=Zg1R

SEMICONDUCTOR MEMORY DEVICE

BACKGROUND OF THE INVENTION

1. Field of the Invention

The present invention relates to a semiconductor memory device, and more particularly to a semiconductor memory device having a configuration that increases the data read rate.

2. Description of the Prior Art

Since in the past, a quick access to a flash memory has been demanded similar to other forms of memory medium. According to the conventional circuit configuration, since the input impedance on the reference cell array side is kept at a constant level for all times, circumstances arise in which the input impedance on the reference cell array side and the input impedance on the main cell array side do not match with each other for some cell arrays selected on the main cell array side. As a result, it has been very difficult to realize a fast access to the main memory cell array.

FIG. 1 is a circuit diagram showing the configuration of a semiconductor memory device according to Prior Art 1. Of the impedances as seen from I-V conversion circuits (current-to-voltage conversion circuits) 2 and 3, the impedance varies depending upon the selected sector on the main cell array side, whereas it does not vary depending upon the selected sector on the reference cell array side, as indicated in FIGS. 4A–4B.

In order to read data in a cell array 1, a cell array 1 selection signal and a reference cell array selection signal are brought to high level, and a node 500 is connected to a node 700, and a node 600 is connected to an I-V conversion circuit 3.

A cell array N select signal (cell array select signal for controlling a cell array select N-channel transistor (N-ch Tr) corresponding to a cell array other than the cell array 1) goes to low level, and a node 501 and a global bit line 4 go to open state. Then, a row decoder 9 of the cell array 1 selects an arbitrary word line, and its column decoder 10 selects an arbitrary sub-bit line 7. The arbitrary sub-bit line selected is connected to the node 500 via the column decoder 10. A row decoder 11 selects a word line connected to a reference cell gate in the reference cell array. The reference sub-bit line 8 is connected to the node 600 via a dummy decoder 12.

Next, the operation of the Prior Art 1 semiconductor memory device will be described. By the transition of an address transaction director (ATD) signal 2 from high to low level, and the transition of a PRE signal from low to high level in a state at T=0, the I-V conversion circuits 2 and 3 are activated to start cell data read operation. The global bit line 4 and the sub-bit line 7 of the cell array 1, and a reference global bit line 5 and the reference sub-bit line 8 of the reference cell array are charged up by the currents from the I-V conversion circuits 2 and 3, respectively.

To describe the operation with reference to the I-V conversion circuits 2 and 3 in FIG. 2, the output of the NOR circuit goes to high level as a result of transition of the ATD signal from high level to low level. As the output of the NOR circuit goes to high level, the global bit line 4 and the reference global bit line 5 are connected to a power supply via an N-ch Tr 1. In addition, as the PRE signal goes to high level, the global bit line 4 (reference global bit line 5 in the I-V conversion circuit 3) is connected to the power supply.

A precharging circuit in the I-V conversion circuits 2 and 3 is provided for supplementing charge-up of each bit line. By the connection of the node 700 and the reference global bit line 5 to the power supply the potentials at the nodes 500, 700 and 600 go up. When the potential reaches the threshold voltage of NOR circuit in the I-V conversion circuits 2 and 3, the N-ch Trs 2 and 5 in the I-V conversion circuits 2 and 3 are turned off. This state represents a state in which the global bit line 4, the sub-bit line 7, the reference global bit line 5 and the reference sub-bit line 8 are fully charged up by the current flowing in the I-V conversion circuits 2 and 3.

According to the conventional circuit configuration, the impedance of the global bit line 4 on the main cell array side and the impedance of the reference global bit lime 5 on the reference cell array side as seen from the I-V conversion circuits 2 and 3 are different as shown in FIG. 4.

FIGS. 9A and 9D are the waveform diagrams showing the waveforms of the current and voltage in respective paths. A current IgsN that flows in the global bit line 4 and a current Igs1 (=Is1) that flows in the sub-bit line 7 start charging of the capacitance of the global bit line 4 and the capacitance of the sub-bit line 7 from T=0 and complete the charging at T=1. When the charging is completed, the current IgsN flowing in the global bit line 4 goes to 0[A]. The current Igs1 flowing in the sub-bit line 7 is the cell current selected in the cell array. A current Im input to the I-V conversion circuit 2 is given by the following formula:

Current $Im = IgsN + Igs1$

Analogously, in the reference part, a current IgrN flowing in the reference global bit line 5 and a current Igr1 flowing in the reference sub-bit line 8 start charging the capacitance of the reference global bit line 5 and the capacitance of the reference sub-bit line 8 at T=0 and completes the charging at T=1. When the charging is completed, the current IgrN flowing in the reference sub-bit line 8 goes to 0[A]. The current Igr1 flowing in the reference sub-bit line 8 is the cell current selected in the cell array. A current Iref that is input to the I-V conversion circuit 3 is given by the following formula:

Current $Iref = IgrN + Igr1$.

Each of the charging currents varies according to the impedance as seen from each of the I-V conversion circuits 2 and 3. Since the impedances on the main cell array side and the impedance on the reference cell array side differ as shown in FIGS. 4A–4B, the currents Im and Iref are different. In the state at T=1, the PRE signal changes from high level to low level, and the precharging circuits in the I-V conversion circuits 2 and 3 stop their operations.

Describing the operation by reference to the I-V conversion circuits 2 and 3 in FIG. 2, as a result of transition of the PRE signal to low level the N-ch Tr 4 in the I-V conversion circuits 2 and 3 is turned off, and the global bit line 4 (reference global bit line 5 in the I-V conversion circuit 3) and the power supply go into an open state.

In the state at T=1, the nodes 500, 700 and 600 are fully charged. During the period from T=1 to T=2, it is necessary for the main cell array side to transmit the current of the selected cell to Im. Since the electric charge stored on the global bit line 4 flows into Igs1, the current Im apparently goes to 0[A].

On the reference cell array side, the reference cell current Iref is transmitted to the I-V conversion circuit 3 at T=1. The transmission takes place since the reference global bit line 5 carries no parasitic capacitance and no excess charge is stored on it.

Accordingly, during the stage from T=1 to T=2, the expected current Iref is transmitted to the I-V conversion circuit 3 in its complete form, but the expected current Im is not transmitted to the I-V conversion circuit 2 in its complete form. Consequently, the outputs Vm and Vref of the I-V conversion circuits 2 and 3 give a difference potential which is not expected. If Vm and Vref are compared in this stage, there is a possibility that the comparator circuit 1 cannot output the exact information, which becomes a cause of malfunction.

During the period from T=2 to T=3, the cell current of a cell actually selected by the cell array 1 starts to flow, and the output Vm of the I-V conversion circuit 2 begins to change. It is only at the stage of T=4 that the expected difference potential is brought about between Vm and Vref.

When the difference potential is established, the comparator circuit 1 compares Vm and Vref at the timing when the ATD 1 signal changes from low level to high level, and outputs a low level signal if the potential of Vm is lower than that of Vref, and outputs a high level signal if the potential of Vm is higher than that of Vref. In FIG. 9B, the potential of Vm is lower than that of Vref so that the comparator circuit 1 is outputting a low level signal. The above is a summary of the configuration and the operation of Prior Art 1.

Next, a semiconductor memory device as disclosed in Japanese Patent Applications Laid Open, No. Hei 11-3599 will be described as Prior Art 2.

The semiconductor memory device has two reference bit lines, and is provided with a means for switching between the two reference bit lines in synchronism with the bit line selection on the main cell array side, and a shield due to a power supply line disposed between the reference bit line and the bit line.

According to the semiconductor memory device of Prior Art 2, the interline capacitances for the bit lines and the reference lines as seen from the differential amplifier side are equal, and since the bit line and the reference line exhibit similar behavior even when a disturbance enters from a peripheral element, stabilized data read becomes possible. Moreover, through the formation of a shield it becomes possible to exclude the effect due to the interline capacitance between the bit line and the reference line.

However, in the semiconductor memory device according to Prior Art 1, the impedances of the global bit line 4 and the reference global bit line 5 as seen from the I-V conversion circuits 2 and 3 are different, so that it gives rise to a problem that the comparator circuit 1 may cause malfunctions. Moreover, if it is desired to avoid malfunctions, it is necessary to shift the comparison times of the voltage Vm on the main cell array side and the voltage Vref on the reference cell array side, giving rise to a problem of slow-down of the reading rate.

In the semiconductor memory device of Prior Art 2, it is true that the problem of flow of inexact current in the sense amplifier part, due to the effect of the capacitance between the sub-bit lines in the cell array or the interline capacitance between the sub-bit line and the reference bit line, can surely be eliminated. However, the problems of malfunction in the sense amplifier part due to the difference in the impedances of the global bit line that connects the cell array and the sense amplifier part and the reference global bit line, and the slow-down of the data read operation remain unresolved.

BRIEF SUMMARY OF THE INVENTION

Object of the Invention

It is the object of the present invention to provide a semiconductor memory device which makes it possible to make the input impedance on the main cell array side and the input impedance on the reference cell array side as seen from the I-V conversion circuits 2 and 3 (sense amplifiers) equal with each other.

SUMMARY OF THE INVENTION

A semiconductor memory device having a plurality of cell arrays and one reference cell array comprises a first current-to-voltage converting means which converts a cell current input from a cell array into a main cell voltage, a second current-to-voltage converting means which converts a reference cell current input from the reference cell array into a reference cell voltage, global bit lines which connect the first current-to-voltage converting means and the plurality of cell arrays, and a dummy global bit line which connects the second current-to-voltage converting means and the reference cell array, where the impedance of the global bit line and the impedance of the dummy global bit line are equal with each other.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 5 is a circuit diagram showing the configuration of the semiconductor memory device of the embodiments according to the present invention;

DETAILEDS DESCRIPTION OF THE INVENTION

Figure 1:
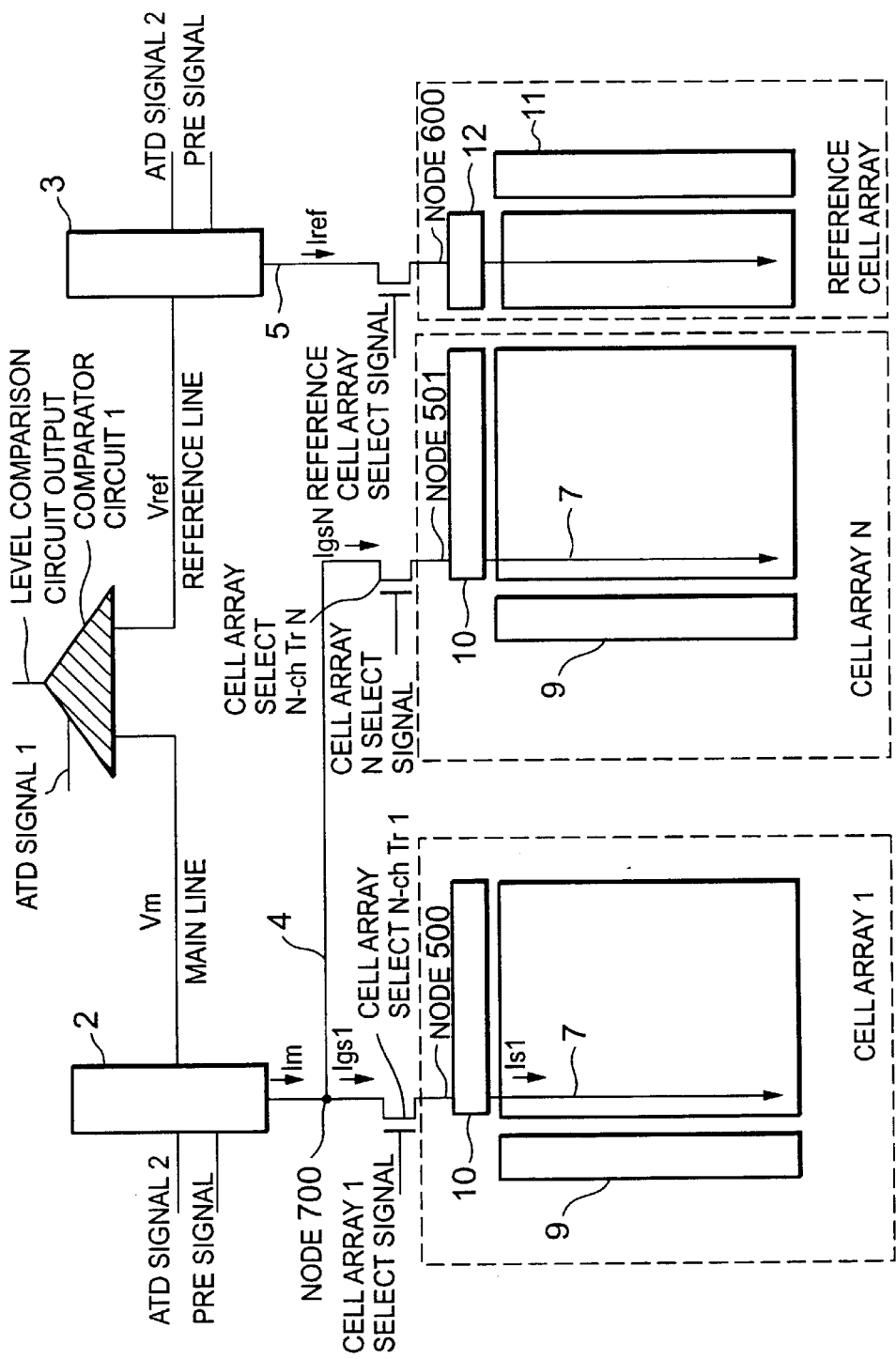
FIG. 1 is a circuit diagram showing the configuration of a semiconductor memory device according to the prior art.

Referring to the drawings, the embodiments of the present invention will be described in the following.

Referring to FIG. 2, FIG. 3, FIG. 5, FIG. 6 and FIG. 7, the configuration of a first embodiment of the semiconductor memory device according to the present invention will be described. FIG. 5 is a circuit diagram showing the configuration of a nonvolatile semiconductor memory device of the invention. The semiconductor memory device comprises a comparator circuit 1, an I-V conversion circuit 2, an I-V conversion circuit 3, a plurality of cell arrays (1 to N), and one reference cell array. Each cell array is equipped with a row decoder 9 (1 to N) and a column decoder 10 for selecting an arbitrary cell within a cell array. The reference cell array is equipped with a row decoder 11 and a dummy decoder 12.

The comparator circuit 1 inputs the output Vm of the I-V conversion circuit 2, the output Vref of the I-V conversion circuit 3 and outputs the result of level comparison to a control part not shown. The cell array 1 to the cell array N are connected to a cell array select N-ch Tr 1 to a cell array select N--ch Tr N, respectively, in order to allow the selection of an arbitrary cell array. The cell array select N-ch Tr 1 to the cell array select N-ch Tr N are controlled by a cell array 1 select signal to a cell array N select signal, respectively. The drains of the cell array select N-ch Tr 1 to the cell array select Tr N are connected in common to the global bit line 4, and the result of combination of the signals of these drains is output to the I-V conversion circuit 2.

The sources and the drains of the reference cell array select N-ch Tr 1 to the reference cell array select N-ch Tr N are connected in common to a dummy global bit line 6. The gates of the reference cell array select N-ch Tr 1 to the reference cell array select N-ch Tr N are controlled respectively by reference cell array select signal 1 to reference cell array select signal N. The drains of the reference cell array select N-ch Tr 1 to the reference cell array select N-ch Tr N are connected in common to the dummy global bit line 6, and the result of the combination of the signals of these gates is output to the I-V conversion circuit 3.

Figure 3:
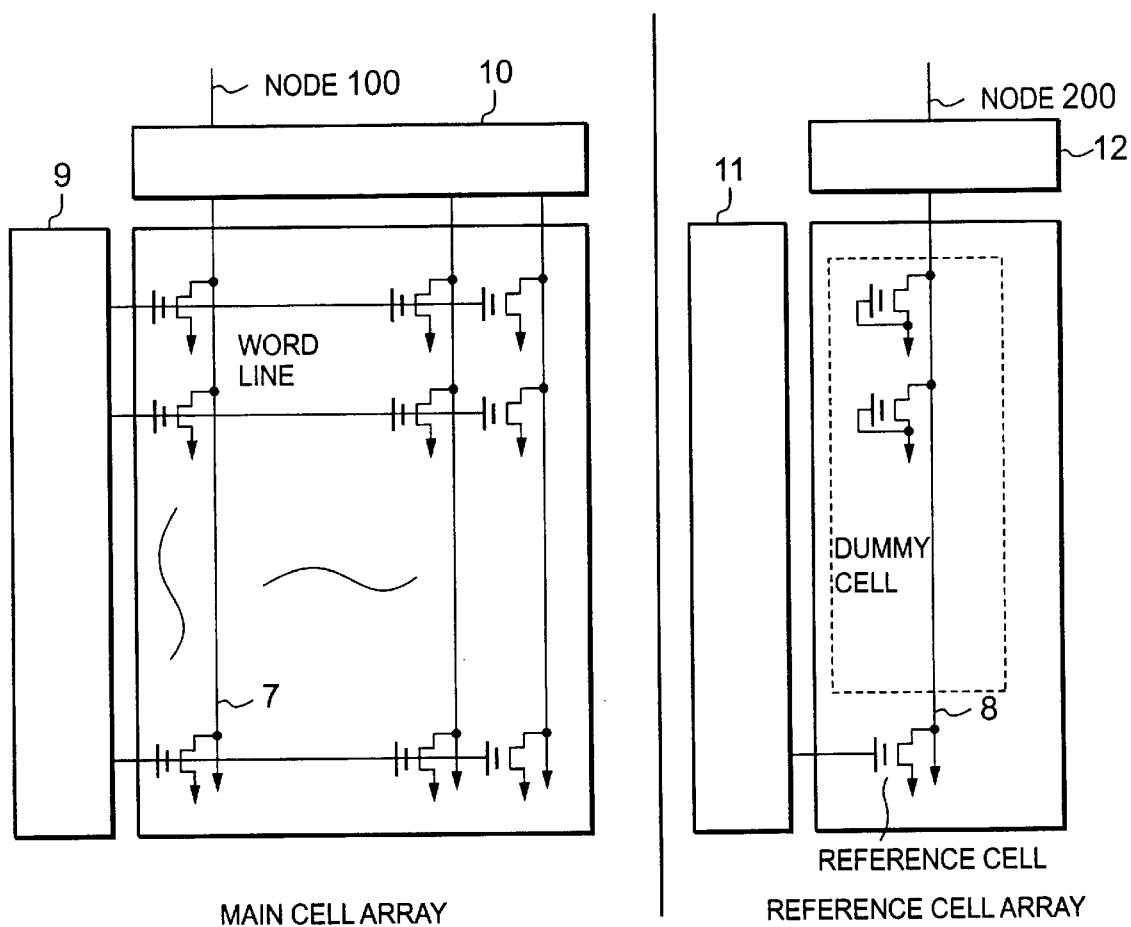
FIG. 3 is a circuit diagram showing a cell array and a reference cell array.
Figure 4B:
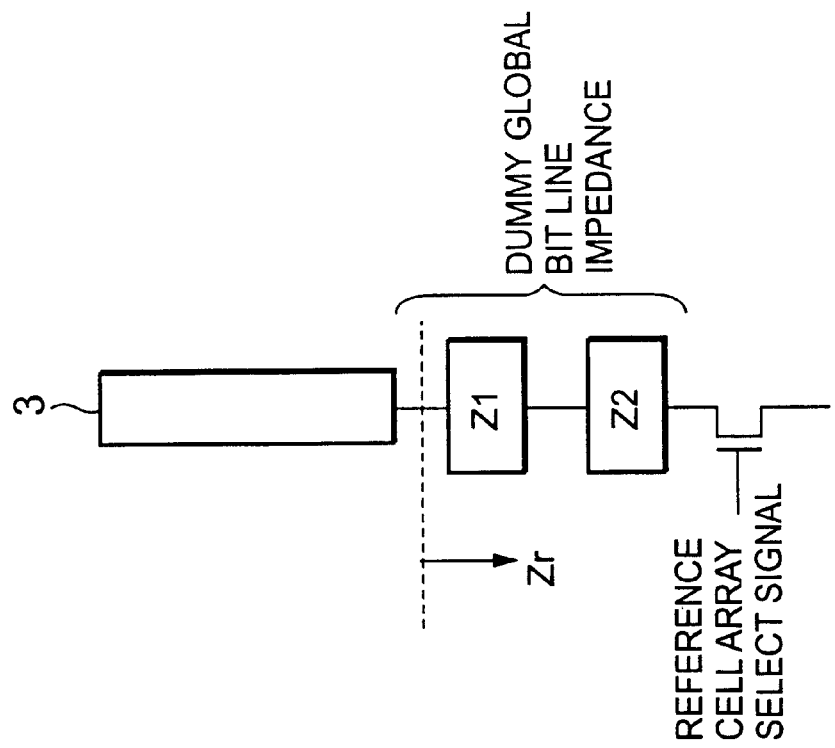
FIGS. 4A and 4B are circuit diagrams for describing impedance of the wirings of a reading system according to the prior art.
Figure 4A:
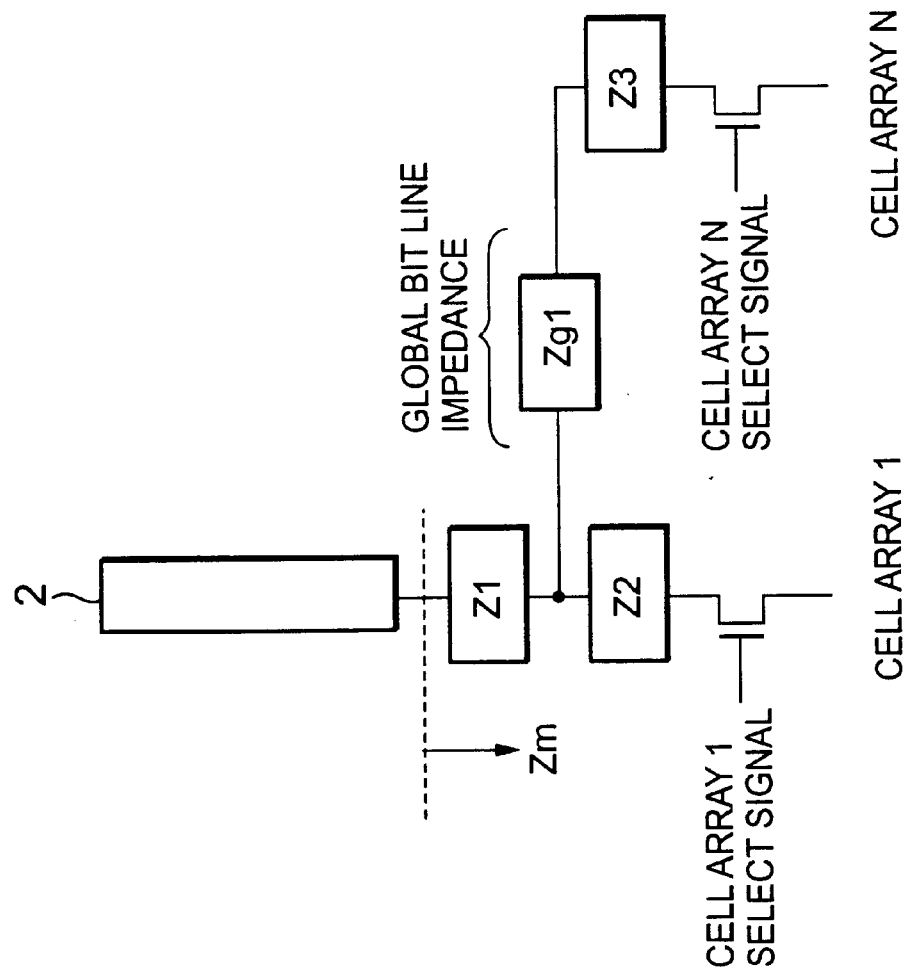

FIG. 3 is a circuit diagram showing the configuration of a cell array. A plurality of cells within the cell array are arranged in a matrix form. Each sub-bit line 7 connects the drains of memory cells in the column direction. Each word line connects in common the gates of memory cells in the row direction.

The row decoder 9 is connected to a plurality of word lines, and is capable of selecting an arbitrary word line. The column decoder 10 is connected to a plurality of sub-bit lines 7, and connects an arbitrary sub-bit line 7 to a node 100. The drain of a reference cell is connected to a reference sub-bit line in the reference cell array. The output of a row decoder 11 of the reference cell array is connected to the gate of the reference cell.

Moreover, the reference sub-bit line 8 is connected to dummy cells equal in number to that of the memory cell arrays that are connected to the sub-bit lines 7 on the main cell array side. A dummy decoder 12 is connected to the reference sub-bit line 8 that is connected in turn to a node 200 via the dummy decoder 12.

Figure 2:
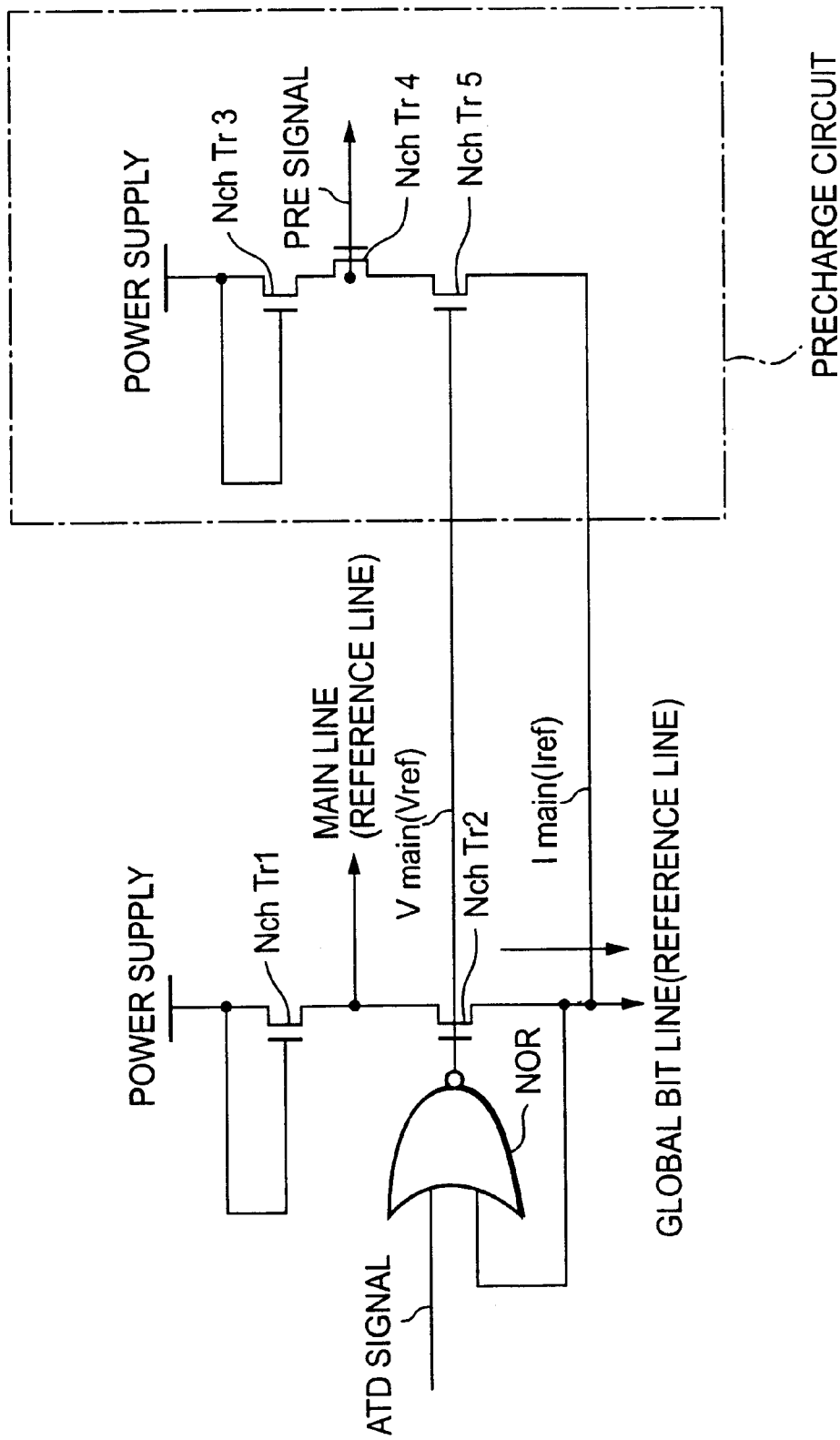
FIG. 2 is a circuit diagram showing the configuration of two I-V conversion circuits.

FIG. 2 is a circuit diagram showing the configuration of the I-V conversion circuits 2 and 3. The I-V conversion circuit 2 and 3 comprise N-ch Tr 1 to N-ch Tr 5 and a NOR circuit. The drain and the gate of the N-ch Tr 1 are connected to a power supply, and its source (main line) is connected to the drain of the N-ch Tr 2. The source of the N-ch Tr 2 is connected to the global bit line 4 (dummy global bit line 6 in the case of the I-V conversion circuit 3), and the gate of the N-ch Tr 2 receives the output of the NOR circuit which inputs the signals of the global bit line 4 (dummy global bit line 6 in the case of the I-V conversion circuit 3) and an ATD 2 signal.

Moreover, the drain and the gate of the N-ch Tr 3 are connected to the power supply, and the source of the N-ch Tr 3 is connected to the drain of the N-ch Tr 4. The gate of the N-ch Tr 4 is controlled by a PRE signal, and the source of the N-ch Tr 4 is connected to the drain of the N-ch Tr 5. The source of the N-ch Tr 5 is connected to the global bit line 4 (dummy global bit line 6 in the case of the I-V conversion circuit 3), and the gate of the N-ch Tr 5 receives the output of the NOR circuit.

Figure 6A:
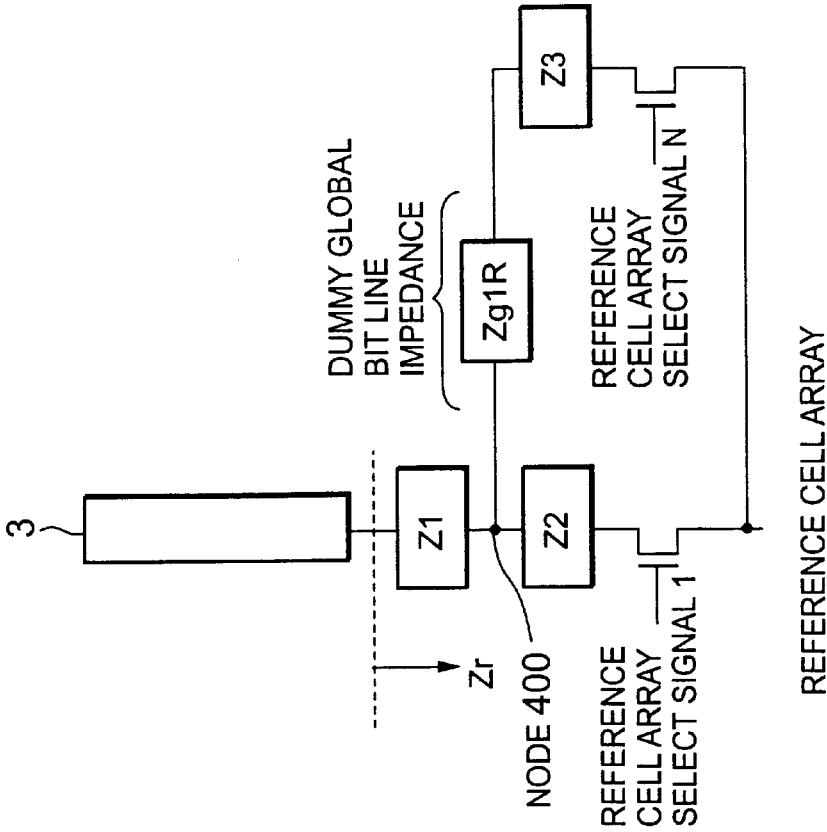
FIGS. 6A and 6B are circuit diagrams for describing the impedances of the wirings of a reading system in the embodiments of the invention.

FIG. 6A is a diagram showing the relationship between the resistances and the capacitances of the wirings from the I-V conversion circuit 2 to the cell array select N-ch Tr 1 and the cell array select N-ch Tr N. In FIG. 6A, the impedance from the I-V conversion circuit 2 to a node 300 is represented by Z1, the impedance from the node 300 to the cell array select N-ch Tr 1 is represented by Z2, and the impedance from the node 300 to the cell array select N-ch Tr N is represented by Zg1 and Z3.

Figure 6B:
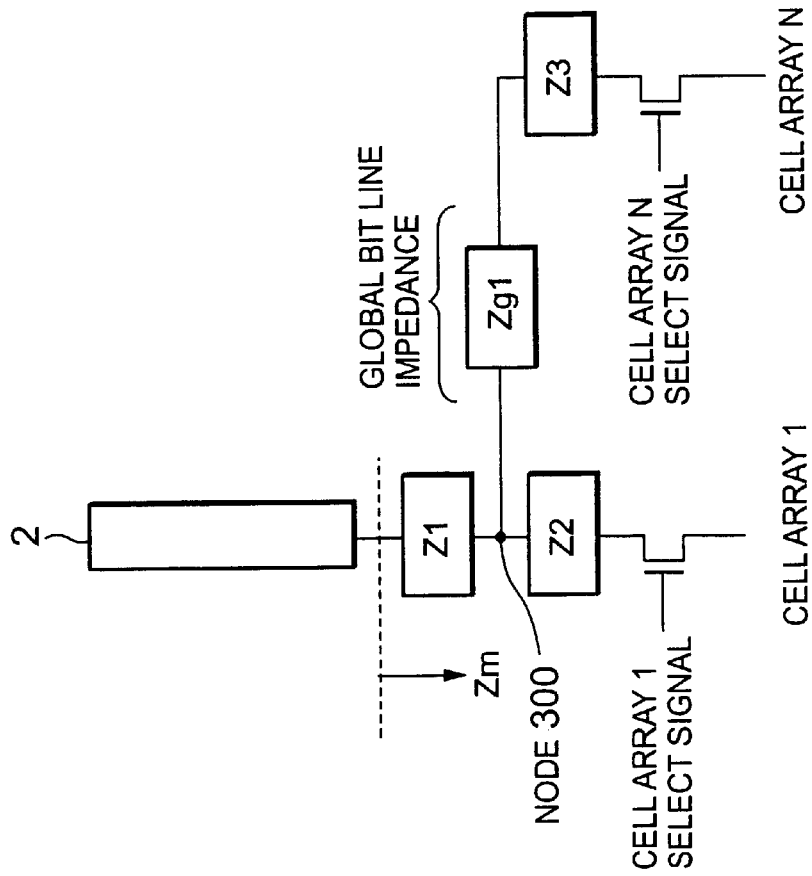

FIG. 6B is a diagram showing the relationship between the resistances and the capacitances of the wirings from the I-V conversion circuit 3 to the reference cell array select N-ch Tr 1 and the reference cell array select N-ch Tr N. In FIG. 6B, the impedance from the I-V conversion circuit 3 to a node 400 is represented by Z1, the impedance from the node 400 to the reference cell array select N-ch Tr 1 is represented by Z2, and the impedance from the node 400 to the reference cell array select N-ch Tr N is represented by Zg1R and Z3.

Figure 7:
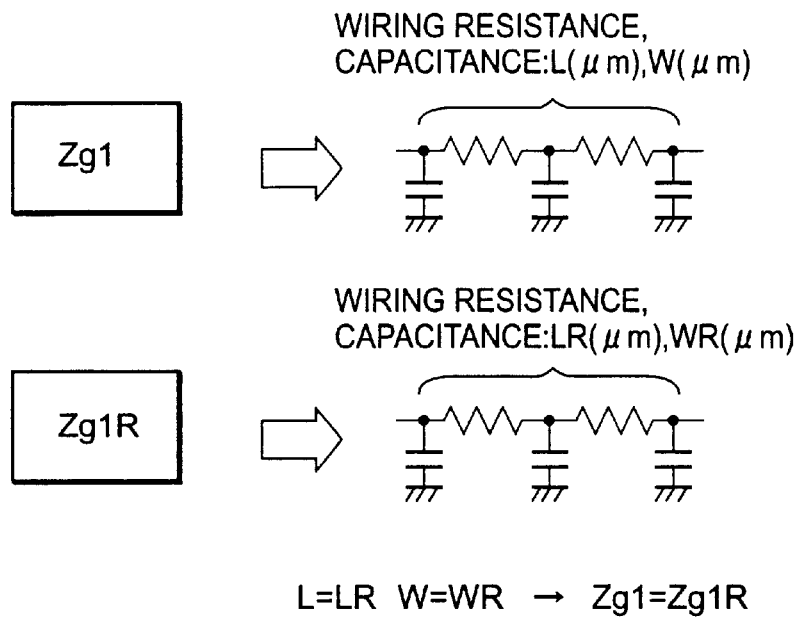
FIG. 7 is an equivalent circuit of the impedance of a global bit line in a first embodiment of the invention.

FIG. 7 is a diagram showing the constitution of Zg1 and Zg1R in FIG. 6B. The impedance Zg1 is generated by the wiring resistance and the wiring capacitance that is determined by the wiring length and the wiring width of the global bit line 4 (wiring resistance=resistance coefficient× wiring length÷wiring width and wiring capacitance= capacitance coefficient×wiring length×wiring width). The impedance Zg1R is generated by the wiring resistance and the wiring capacitance that is determined by the wiring length and the wiring width of the dummy global bit line 6 (wiring resistance=resistance coefficient×wiring length÷wiring width and wiring capacitance=capacitance coefficient×wiring length×wiring width).

Figure 8:
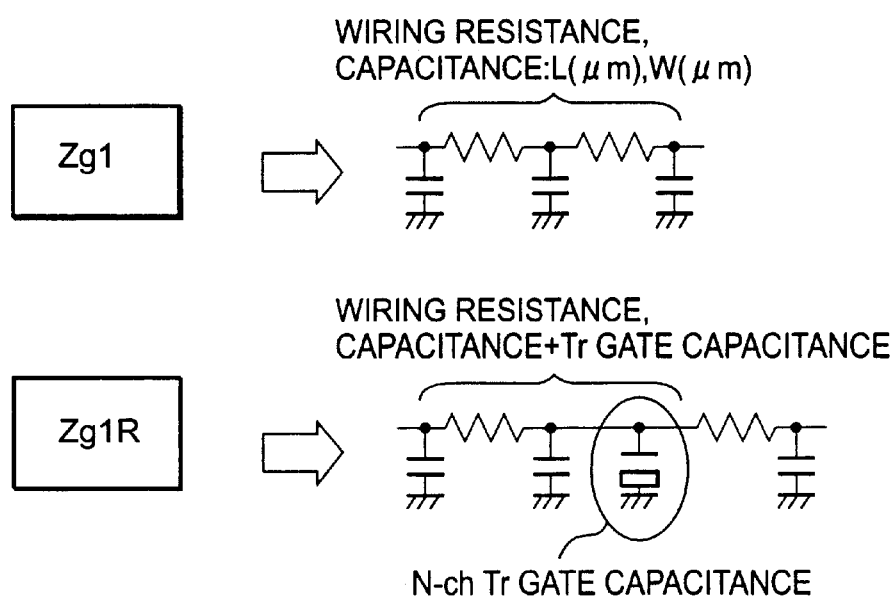
FIG. 8 is an equivalent circuit of the impedance of a global bit line in a second embodiment of the invention.

Referring to FIG. 8, a second embodiment of the invention will be described. In order to make the impedances on the main cell array side and the reference cell array side equal, the global bit line 4 and the dummy global bit line 6 are configured as shown in FIG. 8. The means for equalizing Zg1 and Zg1R is different from that in the first embodiment. The impedance Zg1 is composed of the wiring capacitance and the wiring resistance as shown in the figure. In this embodiment, the impedance Zg1R is composed of the wiring resistance, the wiring capacitance and the gate capacitance of the N-ch Tr in order to set the resistance and the capacitance equal to those on the main cell array side. The remaining configuration is the same as in the first embodiment.

Next, the data read operation in the semiconductor memory device of the first and second embodiments will be described. FIGS. 9C and 9D are timing charts showing the waveforms of the current and the voltage for various paths during the data read operation. When a cell in the cell array 1 is to be read in the state at T=0, the cell array 1 select signal and the reference cell array select signal 1 go to high level, and the node 100 and the node 300 (global bit line 4), and the node 200 and the node 400 (dummy global bit line 6) are connected, respectively.

The cell array N select signal and the reference cell array select signal N go to low level, and the node 101 and the global bit line 4 go to the open state. The row decoder 9 of the cell array 1 selects an arbitrary word line. An arbitrary sub-bit line 7 is connected to the node 100 via the column decoder 10. The row decoder 11 connects an arbitrary word line to the gate of a reference cell in the reference cell array. The reference sub-bit line 8 is connected to the node 200 via the dummy decoder 12.

Moreover, when the ATD signal 2 changes from high level to low level, and the PRE signal changes from low level to high level, the I-V conversion circuits 2 and 3 are activated, and data read operation of the cells is started. As a result, the global bit line 4, the sub-bit line 7 of the cell array 1, the dummy global bit line 6 and the reference sub-bit line 8 of the reference cell array are charged up.

Referring to FIG. 2, as a result of the shift of the ATD signal 2 to low level, the output of the NOR circuit goes to high level, and the global bit line 4 (dummy global bit line 6 in the case of the I-V conversion circuit 3) is connected to the power supply via the N-ch Tr 1. Moreover, as a result of the PRE signal going to high level, the global bit line 4 (dummy global bit line 6 in the case of the I-V conversion circuit 3) is connected to the power supply via the N-ch Trs 3, 4, and 5. The precharge circuit in the I-V conversion circuits 2 and 3 is equipped to supplement the charge-up of respective bit lines.

As a result of connection of the node 300 (global bit line 4) and the node 400 (dummy global bit line 6) to the power supply, the potentials of the nodes 300 and 400 are raised. When the potentials reach the threshold voltage of the NOR circuits in the I-V conversion circuits 2 and 3, the output of the NOR circuit goes to low level, and the N-ch Trs 2 and 5 in the I-V conversion circuits 2 and 3 are turned off. This state is one in which the global bit line 4, the sub-bit line 7, the dummy global bit line 6 and the reference sub-bit line 8 are fully charged up.

FIG. 9C is a timing chart showing the current waveform in each path. The current IgsN flowing in the global bit line 4 and the current Igs1 (=Is1) flowing in the sub-bit line 7 start charging the capacitance of the global bit line 4 and the capacitance of the sub-bit line 7 from T=0, and complete the charging at T=1. When the charging is completed, the current IgsN flowing in the global bit line 4 goes to 0[A]. The current Igs1 that flows in the sub-bit line 7 is the current of the cell selected in the cell array. The current Im input to the I-V conversion circuit 2 is given by the following formula:

Current Im=IgsN+Igs1.

Analogously, in the reference cell array part, the current IgrN flowing in the dummy global bit line 6 and the current Igr1 flowing in the reference sub-bit line 8 start to charge the capacitance of the dummy global bit line 6 and the capacitance of the reference bit line 8 from T=0, and complete the charging at T=1. When the charging is completed, the current IgrN flowing in the dummy global bit line 6 goes to 0[A]. The current Igr1 flowing in the reference sub-bit line 8 is the current of the cell selected in the cell array. The current Iref input to the I-V conversion circuit 3 is given by the following formula:

Current Iref=IgrN+Igr1.

Each charging current varies according to the impedances as seen from the I-V conversion circuits 2 and 3. If the impedances on the main cell array side and on the reference cell array side are made equal, the current Im and the current Iref become almost equal. In order to set the impedance on the main cell array side and the impedance on the reference cell array side equal, it is necessary to configure the global bit line 4 and the dummy global bit line 6 as shown in FIG. 6, and set Zg1 and Zg1R equal. The impedance Zg1 of the global bit line is composed of the wiring capacitance and the wiring resistance as shown in FIG. 7. In order to make the impedances on the main cell array side and on the reference cell array side equal the impedance Zg1R of the dummy global bit line is given an equivalent wiring configuration (wiring length and wiring width) as on the main cell array side.

When the state changes to that at T=1, the PRE signal 2 shifts from high level to low level, and the precharge circuit in the I-V conversion circuits 2 and 3 stops its operation. Referring to FIG. 2, when the PRE signal 2 goes to low level, the N-ch Tr 4 in the I-V conversion circuits 2 and 3 is turned off. When the N-ch Tr 4 is turned off, the global bit line 4 (dummy global bit line 6 in the case of the I-V conversion circuit 3) of the precharge circuit in the I-V conversion circuits 2 and 3 and the power supply go to the open state.

In the state at T=1, the node 300 (global bit line 4) and the node 400 (dummy global bit line 6) are in fully charged state. During the period between T=1 and T=2, it is necessary for the main cell array side to transmit the cell current of the selected cell to Im. Since the charge stored on the global bit line 4 flows into Igs1, the current Im goes to 0 [A] apparently.

Analogously, on the reference cell array side, it is necessary to transmit the reference cell current to Iref. Since the charge stored on the dummy global bit line 6 flows into Igr1, the current Iref goes to 0[A] apparently.

During the period from T=2 to T=3, the cell current of the cell actually selected in the cell array 1, and the reference cell current in the reference cell array start to flow, and the expected difference potential is generated between the outputs Vm and Vref for the I-V conversion circuits 2 and 3.

When the difference potential is generated, the comparator circuit 1 compares Vref and Vm at the timing where the ATD signal shifts from low level to high level, and outputs a low level signal if the potential of Vm is lower than that of Vref, and outputs a high level signal if the potential of Vm is higher than that of Vref. According to FIG. 9D, since the potential of Vm is lower than that of Vref, the comparator circuit 1 is outputting a low level signal. Since the comparison between Vref and Vm is determined by their relative relationship, it is possible for the comparator circuit 1 to start comparison with the time at which the relationship between the two potentials is established, and output the result of the comparison.

Figure 9A:
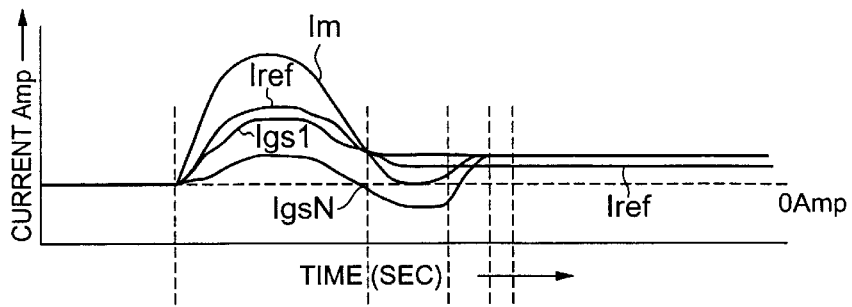
FIGS. 9A to 9D are waveform diagrams at data read in the prior art and in the embodiments of the invention.
Figure 9B:
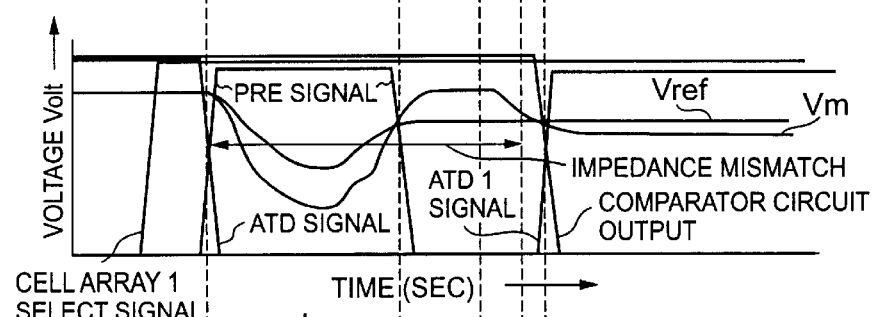
Figure 9C:
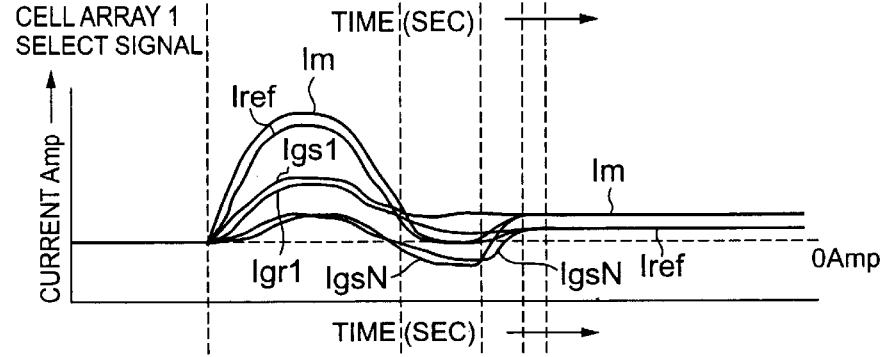
Figure 9D:
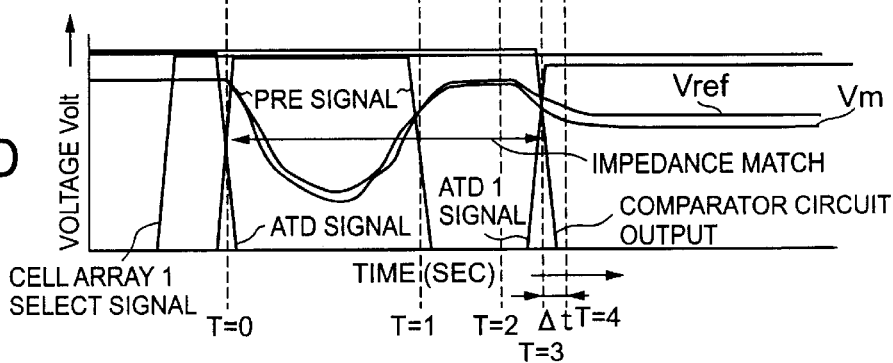

From a comparison between the case of Prior Art 1 in FIG. 9B it can be seen that the time of comparison between Vref and Vm takes place earlier by a time Δt, thereby contributing to the increase in the speed of the data read operation.

As is clear from the description in the above, by bringing the input impedance on the main cell array side to be equal to the input impedance on the reference cell array side, as seen from the I-V conversion circuits 2 and 3, it is possible to increase the reading rate of cell data.

Moreover, by making equal the input impedance on the main cell array side and the input impedance of the reference cell array side as seen from the I-V conversion circuits 2 and 3, after a certain difference in the relative relationship between Vm and Vref is established according to time sequence, changes take place without inversion between their relationship. Consequently, it is possible to reduce the possibility of malfunctions by the comparator circuit 1, and secure stabilized data read operation.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor memory device having a plurality of cell arrays and one reference cell array comprising: a first current-to-voltage converting means for converting a cell current input from said cell array into a main cell voltage; a second current-to-voltage converting means for converting a reference cell current input from said reference cell array into a reference cell voltage; a global bit line which connects said first current-to-voltage converting means and said plurality of cell arrays; a dummy global bit line which connects said second current-to-voltage converting means and reference cell array; wherein the impedance of said global bit line and the impedance of said dummy global bit line are equal.

2. The semiconductor memory device as claimed in claim 1, wherein said dummy global bit line connects said second current-to-voltage converting means and said reference cell array through a plurality of paths.

3. The semiconductor memory device as claimed in claim 2, wherein the number of said plurality of paths is equal to the number of said cell arrays.

4. The semiconductor memory device as claimed in claim 1, wherein the wiring resistance and the wiring capacitance of said global bit line are equal to the wiring resistance and the wiring capacitance of said dummy global bit line.

5. The semiconductor memory device as claimed in claim 1, wherein the wiring length and the wiring width of said global bit line are equal to the wiring length and the wiring width of said dummy global bit line.

6. The semiconductor memory device as claimed in claim 1 further comprising; a first switch means arranged on said global bit line for s electing an arbitrary cell from among said plurality of cell arrays, and forming a path between the selected cell array and said first current-to-voltage converting means; and a second switch means arranged on said dummy global bit line for selecting one path from among a plurality of paths that connect said reference cell array and said second current-to-voltage converting means.

7. The semiconductor memory device as claimed in claim 6, wherein said first switch means are provided in number equal to the number of said cell arrays and are arranged at positions corresponding to respective cell arrays.

8. The semiconductor memory device as claimed in claim 6, wherein the number of said second switch means is equal in number to the number of said first switch means, being arranged on respective paths between said reference cell array and said second current-to-voltage converting means, and when a path is formed between said first current-to-voltage converting means and a cell array that is selected as a result of selection of said cell arrays by said first switch means, selects a path between said reference cell array and said second current-to-voltage converting means that exhibits an impedance which is equal to the impedance of the path between the selected cell array and said first current-to-voltage converting means.

9. The semiconductor memory device as claimed in claim 1 further comprising comparison means for comparing the main cell voltage converted by said first current-to-voltage converting means with the reference cell voltage converted by said second current-to-voltage converting means to output a logic value.

\* \* \* \* \*